United States Patent
Chuo et al.

(10) Patent No.: US 8,216,877 B2
(45) Date of Patent: Jul. 10, 2012

(54) PHASE-CHANGE MEMORY AND FABRICATION METHOD THEREOF

(75) Inventors: Yen Chuo, Taipei (TW); Hong-Hui Hsu, Changhua County (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 13/079,840

(22) Filed: Apr. 5, 2011

(65) Prior Publication Data

US 2011/0177667 A1     Jul. 21, 2011

Related U.S. Application Data

(62) Division of application No. 12/010,885, filed on Jan. 30, 2008, now abandoned.

(30) Foreign Application Priority Data

Feb. 1, 2007  (TW) .............................. 96103661 A

(51) Int. Cl.
    *H01L 45/00* (2006.01)
(52) U.S. Cl. ........... 438/103; 257/E21.004; 257/E21.52; 257/E45.002; 438/696; 438/733
(58) Field of Classification Search ........... 257/E21.004, 257/E21.52, E45.002; 438/102, 103, 696, 438/733
See application file for complete search history.

(56) References Cited

U.S. PATENT DOCUMENTS

| | | |
|---|---|---|
| 3,271,591 A | 9/1966 | Ovshinsky |
| 5,166,758 A | 11/1992 | Ovshinsky et al. |
| 5,177,567 A | 1/1993 | Klersy et al. |
| 5,789,758 A | 8/1998 | Reinberg |
| 6,607,974 B2 | 8/2003 | Harshfield |
| 6,750,079 B2 | 6/2004 | Lowrey et al. |
| 6,830,952 B2 | 12/2004 | Lung |
| 7,545,668 B2 | 6/2009 | Philipp et al. |
| 7,667,222 B2 | 2/2010 | Iwasaki |
| 2003/0219924 A1 | 11/2003 | Bez et al. |
| 2005/0030800 A1 | 2/2005 | Johnson et al. |
| 2005/0212037 A1 | 9/2005 | Pinnow et al. |
| 2006/0039192 A1* | 2/2006 | Ha et al. ................... 365/163 |
| 2006/0245236 A1 | 11/2006 | Zaidi |
| 2007/0018149 A1 | 1/2007 | Sato |
| 2007/0246766 A1* | 10/2007 | Liu ........................... 257/314 |

* cited by examiner

*Primary Examiner* — Anh Phung
*Assistant Examiner* — Michael Lulis
(74) *Attorney, Agent, or Firm* — Birch, Stewart, Kolasch & Birch, LLP

(57) ABSTRACT

A phase-change memory is provided. The phase-change memory comprises a substrate. A first electrode is formed on the substrate. A circular or linear phase-change layer is electrically connected to the first electrode. A second electrode formed on the phase-change layer and electrically connected to the phase-change layer, wherein at least one of the first electrode and the second electrode comprises phase-change material.

7 Claims, 13 Drawing Sheets

PHASE-CHANGE MEMORY AND FABRICATION METHOD THEREOF

CROSS-REFERENCES TO RELATED APPLICATIONS

This application is a Divisional of application Ser. No. 12/010,885, filed on Jan. 30, 2008 now abandoned, the entire contents of which are hereby incorporated by reference and for which priority is claimed under 35 U.S.C. §120. This application also claims priority under 35 U.S.C. §119(a) on patent application Ser. No. 96/103,661 filed Feb. 1, 2007, the entire contents of which are hereby incorporated by reference.

BACKGROUND OF THE INVENTION

1. Field of the Invention

The invention relates to a memory element and fabrication method thereof, and more particularly to a phase-change memory element and fabrication method thereof.

2. Description of the Related Art

Electronic devices use different types of memories, such as DRAM, SRAM and flash memory or a combination based on the requirements of the application, the operating speed, the memory size and the cost considerations of the equipment. Current developments in the memory technology field include FeRAM, MRAM and phase-change memory. Among these alternative memories, phase-change memory is most likely to be mass manufactured in the near future.

Phase-change memory is targeted for applications currently utilizing flash non-volatile memory. Such applications are typically mobile devices which require low power consumption, and hence, minimal programming currents. A phase-change memory cell is designed with several goals in mind: low programming current, higher reliability (including electromigration risk), smaller cell size, and faster phase transformation speed. These requirements often set contradictory requirements on feature size, but a careful choice and arrangement of materials used for the components can often widen the tolerance.

To reduce the programming current, the most straightforward way is to shrink the heating area. A benefit of this strategy is simultaneous reduction of cell size. Assuming a fixed required current density, the current will shrink in proportion to the area. In reality, however, cooling becomes significant for smaller structures, and loss to surroundings becomes more important due to increasing surface/volume ratio. As a result, the required current density must increase as heating area is reduced. This poses an electromigration concern for reliability. Hence, it is important to use materials in the cell which do not pose an electromigration concern. It is also important to improve the heating efficiency, by increasing heating flux in the active programming region while reducing heat loss to the surroundings.

U.S. Pat. No. 6,750,079 discloses a method for fabricating a phase-change memory element 10, referring to FIG. 1. First, a dielectric layer 14 with a perpendicular side wall formed on a substrate 12. Next, a metal layer is conformally formed on the dielectric layer 14 and substrate 12. Next, the metal layer is subjected to an anisotropic etching to form a metal spacer 16 with smaller top surface. Next, a dielectric layer 18 is formed to cover the side walls of the metal spacer 16. Finally, a phase-change layer 20, an electrode 22 and a protective layer 24 are subsequently formed on the substrate.

Therefore, it is necessary to develop a phase-change memory to solve the previously described problems.

BRIEF SUMMARY OF THE INVENTION

An exemplary embodiment a phase-change memory element comprises a substrate. A first electrode is formed on the substrate. A circular or linear phase-change layer is electrically connected to the first electrode. A second electrode formed on the phase-change layer and electrically connected to the phase-change layer, wherein at least one of the first electrode and the second electrode comprises phase-change material.

Methods of manufacturing phase-change memory elements are also provided. An exemplary embodiment of a method comprises the following steps: providing a substrate; forming a first electrode on the substrate; forming a first dielectric layer on the first electrode; patterning the first dielectric layer to form a dielectric pillar, wherein the top view of the dielectric pillar is circle or polygon; conformally forming a phase-change material to cover the dielectric pillar and etching back the phase-change material to remove phase-change material on the top surface of the dielectric pillar and first electrode, remaining a phase-change material spacer on the side walls of the dielectric pillar; forming a second dielectric layer on the substrate and etching back the second dielectric layer to expose the top surface of the phase-change material spacer; and forming a second electrode on the dielectric pillar and second dielectric layer to electrically connect to the phase-change material.

According to another exemplary embodiment of the invention, the method of manufacturing phase-change memory element comprises the following steps. providing a substrate; forming a first electrode on the substrate; forming a first dielectric layer on the first electrode; patterning the first dielectric layer to form an opening, wherein the top view of the opening is circle or polygon; conformally forming a phase-change material on the first dielectric layer to cover the opening and etching back the phase-change material to remain a phase-change material spacer on the side walls of the opening; forming a second dielectric layer on the substrate and etching back the second dielectric layer to expose the top surface of the phase-change material spacer; and forming a second electrode on the opening and the second dielectric layer to electrically connect to the phase-change material spacer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
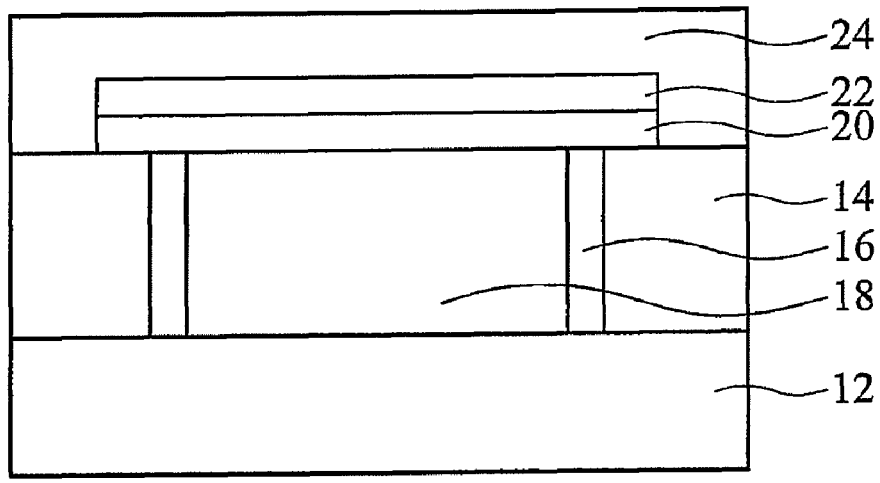
FIG. 1 is a cross section of conventional phase-change memory element.
Figure 2A:
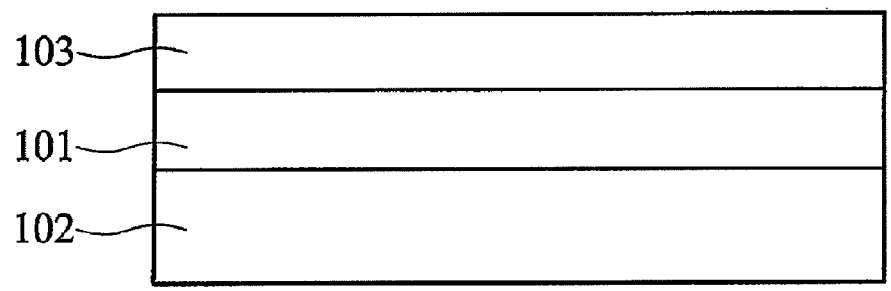
FIGS. 2a-2g are cross sections of a method of fabricating a phase-change memory element according to an embodiment of the invention.

First, referring to FIG. 2a, a first electrode 101 is formed on a substrate 102. Particularly, the substrate 102 can be a substrate employed in a semiconductor process, such as silicon substrate. The substrate 102 can be a substrate comprising a complementary metal oxide semiconductor (CMOS) circuit, isolation structure, diode, or capacitor. The accompanying drawings show the substrate 102 in a plain rectangle in order to simplify the illustration. Herein, the first electrode 101 comprises phase-change material such as chalcogenide (In, Ge, Sb, Te or combinations thereof), for example GeSbTe or InGeSbTe. Further, the first electrode 101 also can be metal or metal alloy, such as Al, W, Mo, TiN, or TiW.

Figure 2B:
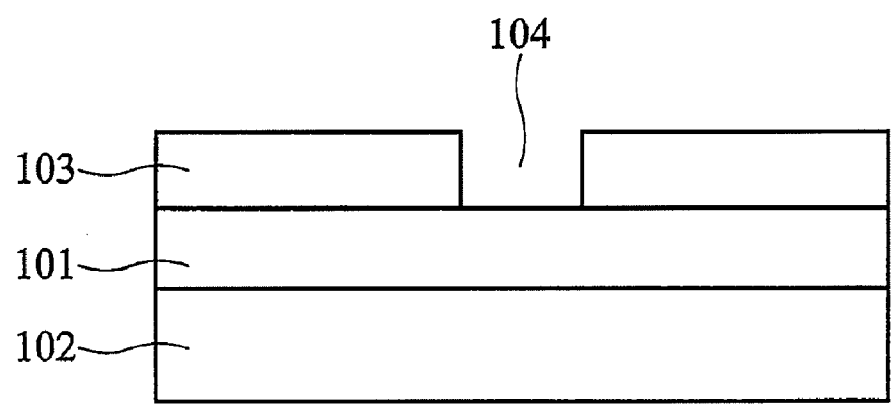

Next, referring to FIG. 2b, a first dielectric layer 103 is formed on the first electrode 101. The dielectric layer 103 can be silicon-containing compound, such as silicon nitride or silicon oxide. Next, the first dielectric layer 103 is patterned to form an opening 104, wherein the opening 104 has a width of 20 nm~500 nm, or 40 nm~200 nm, such as 60 nm.

Figure 2C:
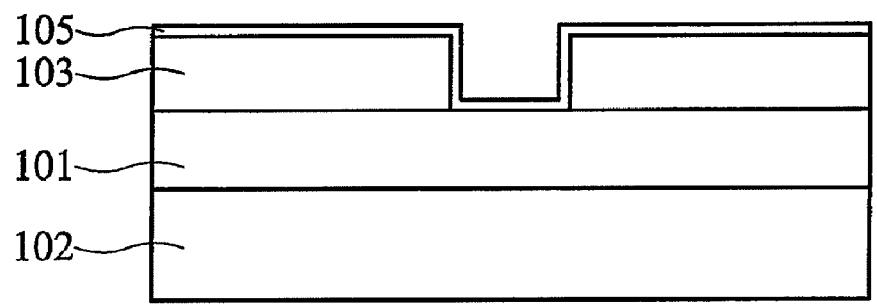

Next, referring to FIG. 2c, a phase-change layer 105 is conformally formed on the first dielectric layer 103 and the first electrode 101 to cover the side walls and the bottom of the opening 104. The phase-change layer 105 comprises chalcogenide (In, Ge, Sb, Te or combinations thereof), for example GeSbTe or InGeSbTe.

Figure 2D:
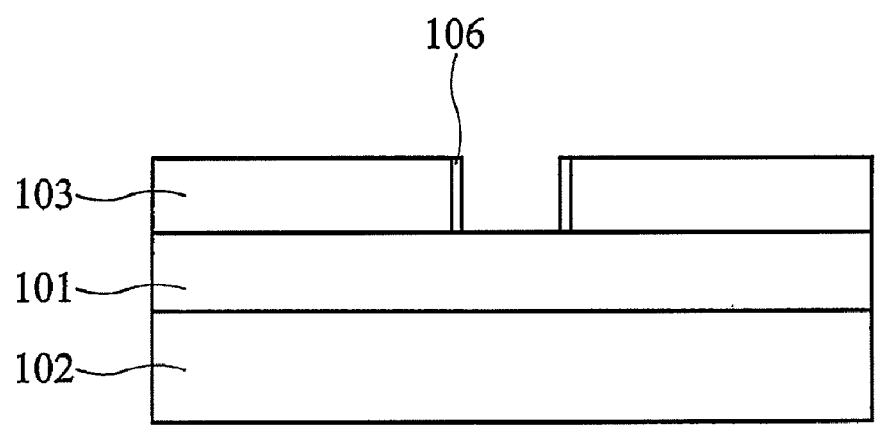

Referring to FIG. 2d, the phase-change layer 105 is etched back with the first dielectric layer 103 and the first electrode 101 acting as etching stopper, thereby remaining a phase-change material spacer 106 on the side walls of the opening 104. The phase-change material spacer 106 can be a closed curve, such as a circular phase-change material spacer. It should be noted that the width of the phase-change material spacer 106 has a dimension less than the resolution limit of photolithography process. Further, the dimensions of phase-change material spacer 106 from top to bottom are the same, and the phase-change layer is essentiality perpendicular to the first electrode and second electrode. The phase-change material spacer 106 has a width of 2 nm~120 nm, or 10 nm~50 nm, such as 20 nm. The height of the phase-change material spacer 106 is 1 nm~200 nm, or 5 nm~80 nm, such as 20 nm.

Figure 2E:
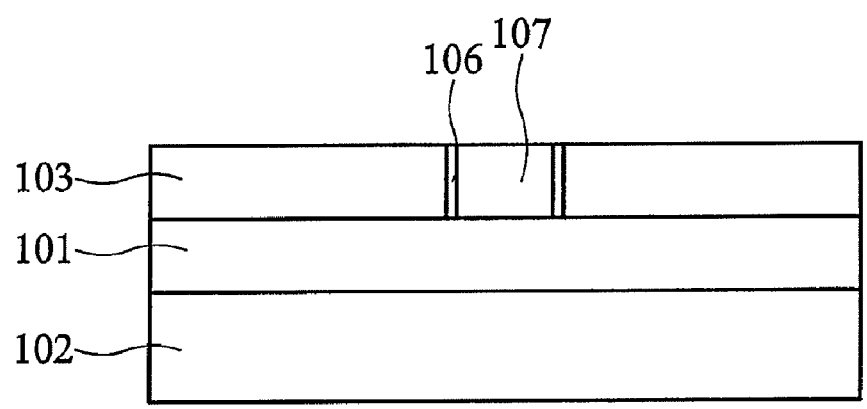

Referring to FIG. 2e, a second dielectric layer 107 is formed on the substrate and subjected to a back-etched, covering the sidewalls of the phase-change material spacer 106.

Figure 2F:
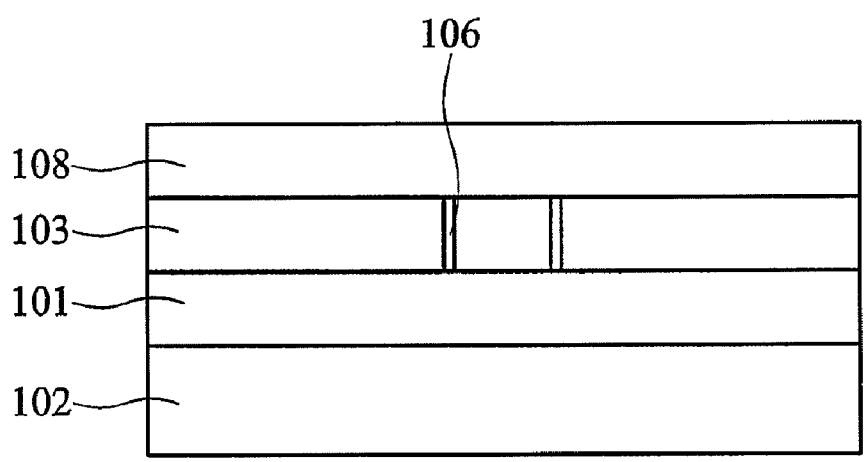

Next, referring to FIG. 2f, a second electrode 108 is formed on the first and second dielectric layer 103 and 107 and electrically connected to the phase-change material spacer 106. The second electrode 108 also comprises phase-change material.

Figure 2G:
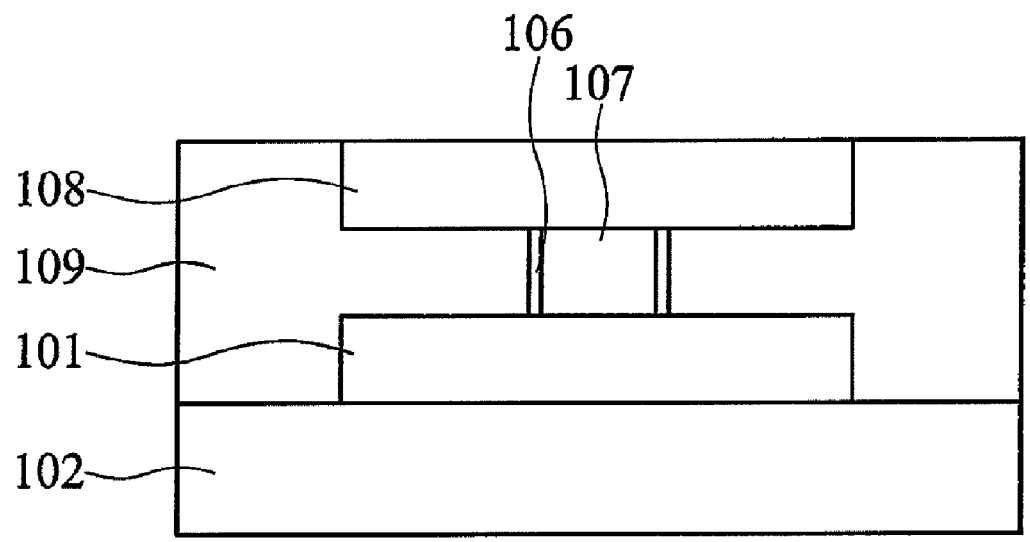
Figure 3:
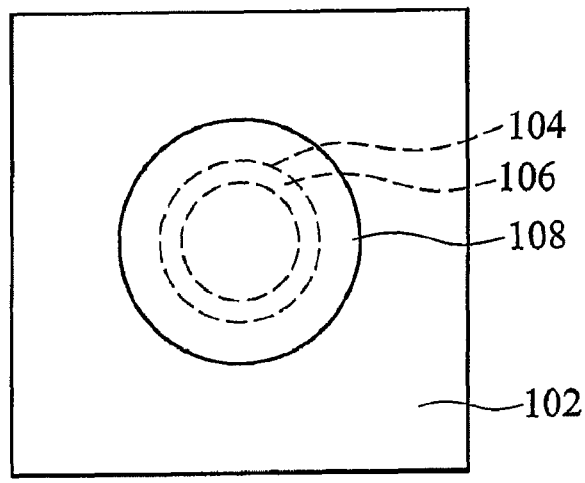
FIG. 3 is a top view of the phase-change memory element of FIG. 2g.
Figure 4:
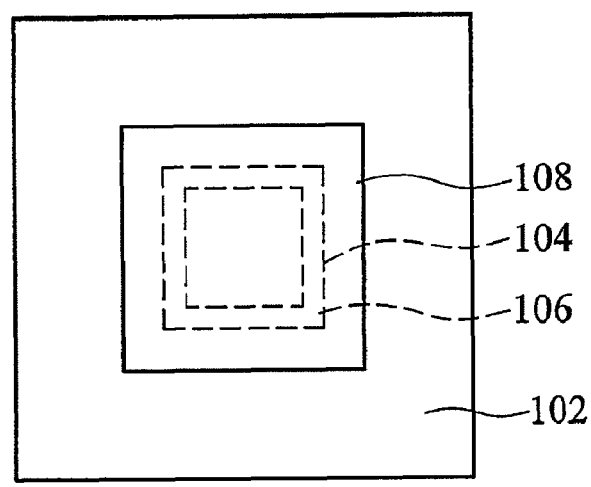
FIG. 4 is an alternative top view of the phase-change memory element of FIG. 2g.
Figure 5A:
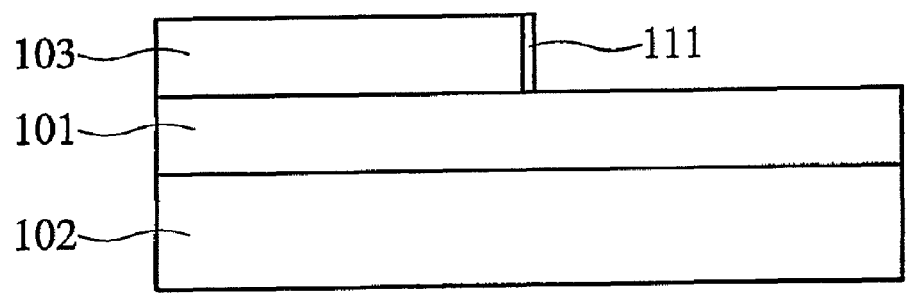
FIGS. 5a-5c are cross sections of a method of fabricating a phase-change memory element according to another embodiment of the invention.
Figure 5B:
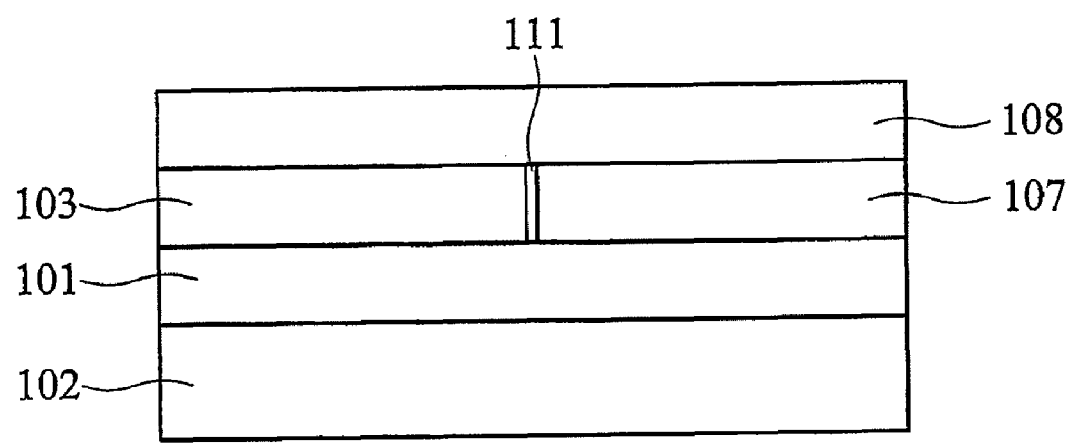
Figure 5C:
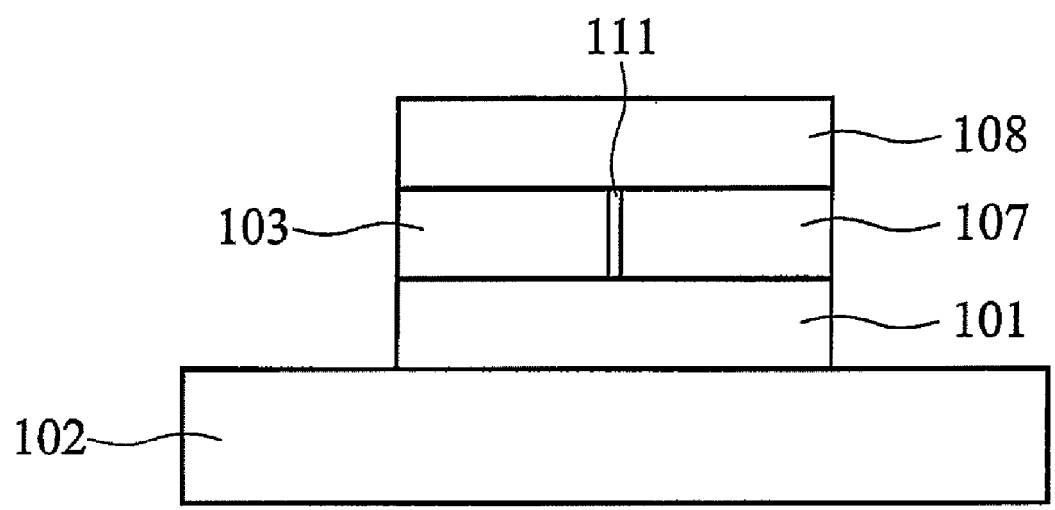
Figure 6:
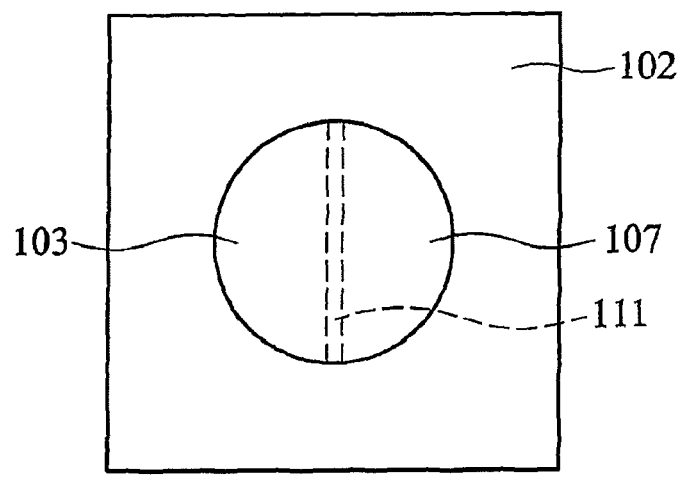
FIG. 6 is a top view of the phase-change memory element of FIG. 5c.
Figure 7:
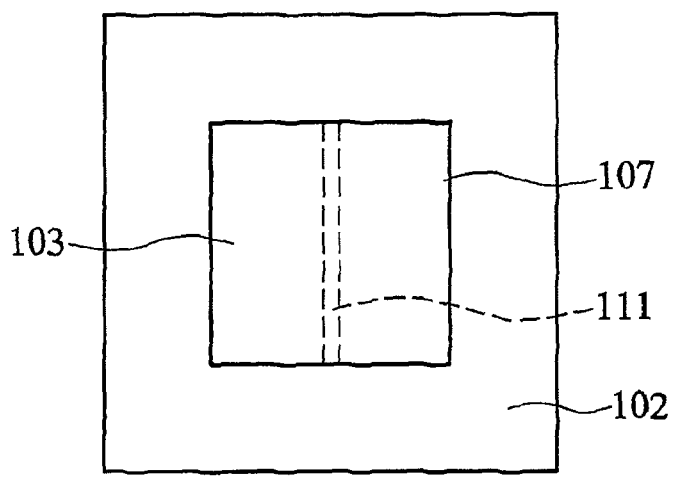
FIG. 7 is an alternative top view of the phase-change memory element of FIG. 5c.

Finally, referring to FIG. 2g, the above structure is patterned and a third dielectric layer 109 is formed to surround the pattern first and second electrodes, thereby defining a isolated phase-change memory element 100. FIGS. 3 and 4 show the top views of the phase-change memory element 100. Accordingly, the top view of the opening 104 can be circle or polygon and the top view of first electrode 101 and second electrode 107 also can be circle or polygon According to another embodiment of the invention, after the process as disclosed in FIG. 2e, the phase-change material spacer is patterned to form a non-continuous (such as linear) phase-change material spacer 111, referring to FIG. 5a. Next, referring to FIG. 5b, a second dielectric layer 107 is formed on the substrate and subjected to a back-etched, covering the sidewalls of the phase-change material spacer 111. Next, a second electrode 108 is formed on the first and second dielectric layer 103 and 107 and electrically connected to the linear phase-change material spacer 111. Finally, the above substrate is patterned to isolate phase-change memory element, referring to FIG. 5c. FIGS. 6 and 7 show the top views of the phase-change memory element as disclosed in FIG. 5c.

FIGS. 8a to 8g are sectional diagrams illustrating another embodiment of the manufacturing process of the phase-change memory element 200.

Figure 8A:
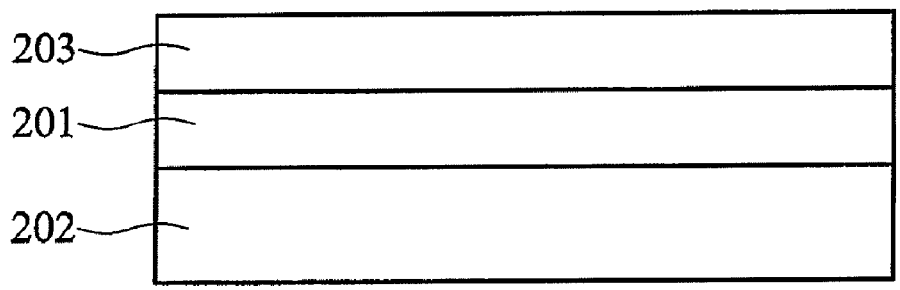
FIGS. 8a to 8g are cross sections of a method of fabricating a phase-change memory element according to still another embodiment of the invention.

First, referring to FIG. 8a, a first electrode 201 is formed on the substrate 202. The substrate 202 can be a substrate comprising a complementary metal oxide semiconductor (CMOS) circuit, isolation structure, diode, or capacitor. The accompanying drawings show the substrate 202 in a plain rectangle in order to simplify the illustration. Herein, the first electrode 201 comprises phase-change material such as chalcogenide (In, Ge, Sb, Te or combinations thereof), for example GeSbTe or InGeSbTe. Further, the first electrode 201 also can be metal or metal alloy, such as Al, W, Mo, TiN, or TiW.

Figure 8B:
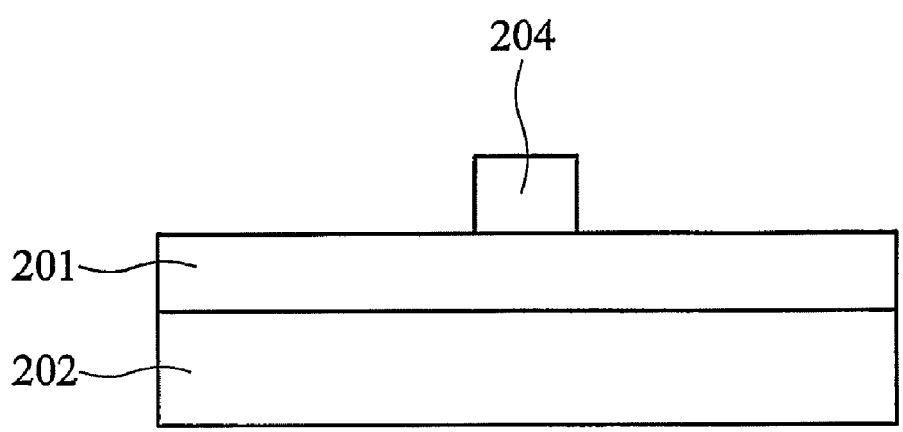

Next, a first dielectric layer 203 is formed on first electrode 201. The dielectric layer 203 can be silicon-containing compound, such as silicon nitride or silicon oxide. Referring to FIG. 8b, the first dielectric layer 203 is patterned to form a dielectric pillar 204. The dielectric pillar 204 has a width of 20 nm~500 nm, or 40 nm~200 nm, such as 60 nm.

Figure 8C:
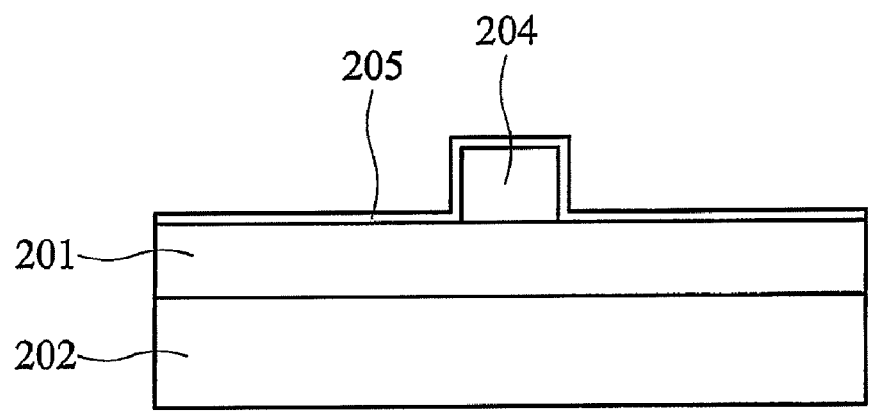

Next, referring to FIG. 8c, a phase-change layer 205 is conformally formed on dielectric pillar 204 and the first electrode 201 to cover the side walls and top surface of the dielectric pillar 204. The phase-change layer 205 comprises chalcogenide (In, Ge, Sb, Te or combinations thereof), for example GeSbTe or InGeSbTe.

Figure 8D:
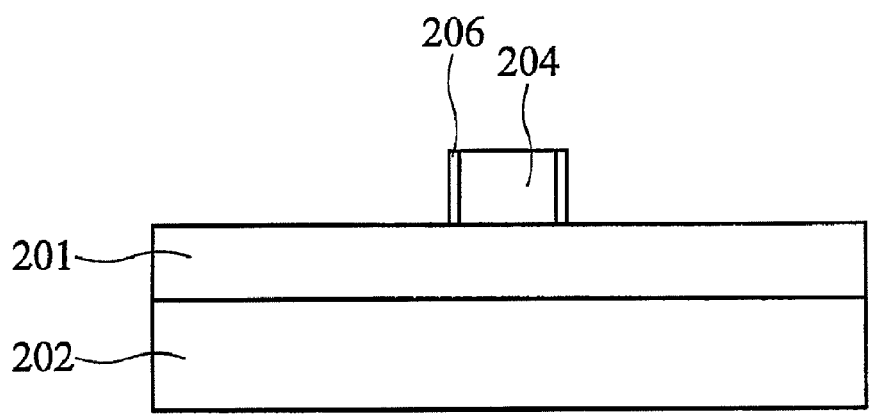

Referring to FIG. 8d, the phase-change layer 205 formed on the dielectric pillar 204 and first electrode 201 is removed via back-etched, remaining a phase-change material spacer 206 covering the sidewalls of the dielectric pillar 204.

The phase-change material spacer 206 can be a closed curve, such as a circular phase-change material spacer. It should be noted that the width of the phase-change material spacer 206 has a dimension less than the resolution limit of photolithography process. Further, the dimensions of phase-change material spacer 206 from top to bottom are the same, and the phase-change material spacer 206 is essentiality perpendicular to the first electrode and second electrode. The phase-change material spacer 206 has a width of 2 nm~120 nm, or 10 nm~50 nm, such as 20 nm. The height of the phase-change material spacer 206 is 1 nm~200 nm, or 5 nm~80 nm, such as 20 nm.

Figure 8E:
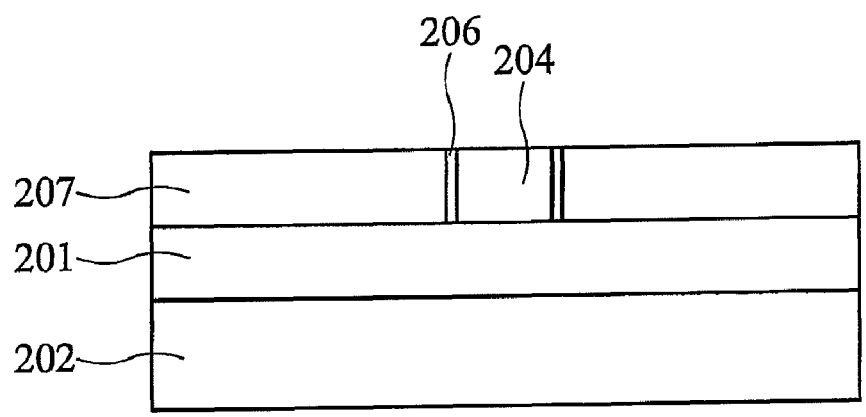

Referring to FIG. 8e, a second dielectric layer 207 is formed on the substrate and subjected to a back-etched, covering the sidewalls of the phase-change material spacer 206.

Figure 8F:
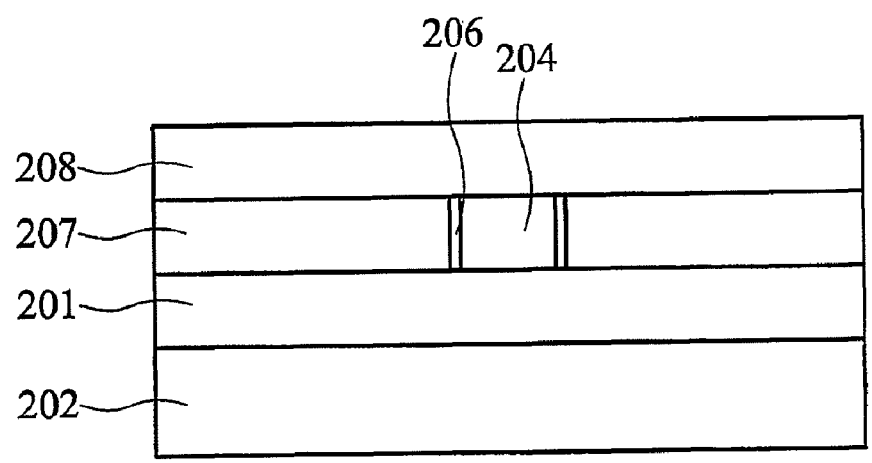

Next, referring to FIG. 8f, a second electrode 208 is formed on the first and second dielectric layer 203 and 207 and electrically connected to the phase-change material spacer 206.

Figure 8G:
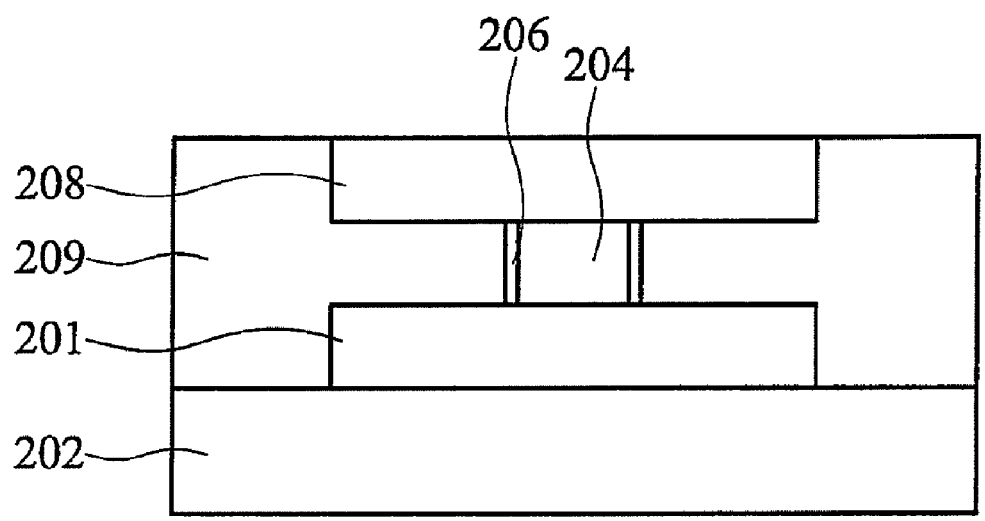

Finally, referring to FIG. 8g, the above structure is patterned and a third dielectric layer 209 is formed to surround the pattern first and second electrodes, thereby defining an isolated phase-change memory element 200.

Accordingly, embodiments of the invention provide method for fabricating phase-change material spacer, wherein the width of the top and bottom surfaces can be less than the resolution limit of photolithography process. Since the dimensions of phase-change material spacer from top to bottom are the same and the phase-change layer is essentiality, the disclosed phase-change memory element exhibits great temperature uniformity when applying a voltage pulse. Moreover, the fabrication process is relatively simple and can accommodate various cell designs, and low cost can be maintained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating phase-change memory elements, comprising:
   providing a substrate;
   forming a first electrode on the substrate;
   forming a first dielectric layer on the first electrode;
   patterning the first dielectric layer to form a dielectric pillar, wherein the top view of the dielectric pillar is circle or polygon;
   conformally forming a phase-change material to cover the dielectric pillar and etching back the phase-change material to remove phase-change material on the top surface of the dielectric pillar and first electrode, a phase-change material spacer remaining on the side walls of the dielectric pillar;
   forming a second dielectric layer on the substrate and subjecting the second dielectric layer to a back-etch, the second dielectric layer covering the sidewalls of the phase-change material spacer;
   forming a second electrode on the dielectric pillar and second dielectric layer to electrically connect to the phase-change material; and
   after forming the second electrode, patterning the first electrode and the second electrode with the substrate acting as an etching-stop, and blanketly forming a third dielectric layer to surround the electrodes.

2. The method as claimed in claim 1, wherein the phase-change material spacer has a width of 2 nm to 120 nm and a height of 1 nm to 200 nm.

3. The method as claimed in claim 1, wherein at least one of the first electrode and the second electrode comprises phase-change material.

4. The method as claimed in claim 1, wherein the top view of the phase-change material spacer is closed curve.

5. The method as claimed in claim 1, after forming the phase-change material spacer, further comprising: patterning the phase-change material spacer to form a non-continuous phase-change material spacer.

6. The method as claimed in claim 1, wherein the first electrode and the second electrode are patterned by different patterning processes.

7. The method as claimed in claim 1, wherein the dielectric pillar has a width of 20 nm to 500 nm.

* * * * *